United States Patent [19]

Koshy et al.

[11] Patent Number: 5,856,276

[45] Date of Patent: Jan. 5, 1999

[54] CERAMIC SUBSTRATE USEFUL FOR THE PREPARATION OF SUPERCONDUCTING FILMS AND A PROCESS FOR PREPARING THE FILMS

[75] Inventors: Jacob Koshy; Jijimon Kumpukkattu Thomas; Jose Kurian; Yogendra Prasad Yadava; Alathoor Damodaran Damodaran, all of Trivandrum, India

[73] Assignee: Council of Scientific & Industrial Research, New Delhi, India

[21] Appl. No.: 924,662

[22] Filed: Sep. 5, 1997

Related U.S. Application Data

[63] Continuation of Ser. No. 506,885, Aug. 14, 1995, abandoned, which is a continuation of Ser. No. 221,154, Mar. 31, 1994, abandoned.

[51] Int. Cl.[6] .................................................... H01L 39/00
[52] U.S. Cl. ........................ 505/239; 505/238; 505/701; 428/697; 428/701; 428/702; 428/930
[58] Field of Search ..................... 505/238, 239, 505/701, 220, 230, 237; 428/697, 699, 701, 702, 930

[56] References Cited

U.S. PATENT DOCUMENTS

| 5,314,871 | 5/1994 | Nakamura | 505/741 |
|---|---|---|---|
| 5,741,747 | 4/1998 | Koshy et al. | 501/135 |

OTHER PUBLICATIONS

Low Surface Resistance YBCO Thick Films by M. McN Alford, T.W. Button and D. Opie (1991), pp. 433–435, Supercond. Sci. Technol., vol. 4.

Grain Growth Enhancement in Silver–Doped $YBa_2Cu_3O_{7-x}$ Superconductor by G. Kozlowski, S. Rele, D. F. Lee and K. Salama, pp. 1056–1060, J. Mater. Sci., vol. 26 (1991).

RF Squid Behaviour in YBCO Thick Films Up To 85 K by Andraj Khare, A.K. Gupta, Sangeeta Chaudhry and V.S. Tomar (Feb. 1991), pp. 107–109, Supercond. Sci. Technol., vol. 4.

Preparation of Perovskite Oxides for High $T_c$ Superconductor Substrates by C.D. Brandle and V.J. Fratello (Oct. 1990), pp. 2160–2164, J. Mater. Res., vol. 5, No. 10.

High–$T_c$ of Undoped and Fluorine–Doped $YBa_2Cu_3O_y$ Films On Ceramic Substrates By Screen Printing by Narottam P. Bansal (Feb. 1992), pp. 7–11, Materials Letters, vol. 13.

Low Surface Resistance in $YBa_2CU_3O_x$ Melt–Processed Thick Films by N. Mc N. Alford, T.W. Button, M.J. Adams, S. Hedges, B. Nicholson and W.A. Philips (Feb. 1991), pp. 680–683, Nature, vol. 349.

Chemical Interaction Between $Ba_2CU_3O_{7-\delta}$ and Substrate Materials In The Solid State by Hideomia Koinuma, Kunio Fukuda, Takuya Hashimoto and Kazuo Fueki (Jul. 1988), pp. 1216–1218, Jap. Journal of Applied Physics, vol. 27, No. 7.

Y–Ba–Cu–O Superconducting Films Grown on (100) Magnesia and Sapphire Substrates By A Melt Growth Method Without Crucible by L.H. Perng, T.S. Chin, K.C. Chen and C.H. Lin (1990), pp. 233–237, Superconduct. Sci. Technol., vol. 3.

Brousse et al, "Superconducting Screen Printed Thick Films of $YBa_2Cu_3O_7$ and $Bi_{1-6}Pb_{0-4}Sr_{1-6}Co_{2-4}Cu_3O_{10}$ on polycrystalline substrates", Appl. Phys. A49, pp. 217–220 (1989).

*Primary Examiner*—Marie Yamnitzky
*Attorney, Agent, or Firm*—Pennie & Edmonds LLP

[57] ABSTRACT

A novel ceramic substrate useful for the preparation of superconducting films, said substrate having the formula $REBa_2MO_6$ where RE represents rare earth metals—Ce, Pr, Nd, Sm, Eu, Gd, Tb, Dy, Ho, Er, Tm, Yb, Lu and M represents metals Nb, Sb, Sn, Hf, Zr; and a process for the preparation of superconducting $YBa_2Cu_3O_{7-\delta}$ thick films on new ceramic substrate.

4 Claims, 6 Drawing Sheets

CERAMIC SUBSTRATE USEFUL FOR THE PREPARATION OF SUPERCONDUCTING FILMS AND A PROCESS FOR PREPARING THE FILMS

This is a continuation of application Ser. No. 08/506,885, filed Aug. 14, 1995, now abandoned, which is a continuation of application Ser. No. 08/221,154, filed Mar. 31, 1994, now abandoned.

FIELD OF THE INVENTION

This invention relates to novel ceramic substrates for $YBa_2Cu_3O_{7-\delta}$ films; a process for the preparation of such substrates and a process for the preparation of superconducting $YBa_2Cu_3O_{7-\delta}$ thick films on the new ceramic substrates.

BACKGROUND OF THE INVENTION

In the preparation of $YBa_2Cu_3O_{7-\delta}$ (YBCO) thick and thin films, choice of substrate is a key factor. Chemical non-reactivity between the substrate and YBCO is the most crucial for obtaining a superconducting high $T_{c(o)}$ film. Besides, for microwave applications, the substrate should have very low dielectric constant (=10) and the loss factor ($10^{-4}$–$10^{-5}$) at GHz frequencies [Brandle and Fratello, J. Mater. Res., 5, 2160 (1990)]. For epitaxial growth of the film, lattice matching is also important. MgO is the most widely reported substrate material which satisfies the above substrate characteristics reasonably well for YBCO films. However, MgO do form an interlayer of Ba salt at the YBCO-MgO interface if the temperature of processing is above 700° C. [Koinuma et al., Jpn J. Appl. Phys. 27, L1216 (1988), Cheung and Ruckenstein, J. Mater. Res. 4, 1 (1989) and Preng et al., Supercond. Sci. Technol. 3, 233 (1990)]. At higher temperatures (>700° C.) chemical interdiffusion of the cation across the film boundary in YBCO-MgO is quite prominent [Hu et al., "Advances in Superconductivity", (Proc. 1st Inter. Symp. on Supercond. ISS 88. Aug. 28–31, 1988, Nagoya, Japan), Edited by K. Kitazawa and I. Ishiguro, Springer-Verlag, Tokyo, p. 647 (1989) and Li et al., J. Mater. Sci., 26, 1057 (1991)]. In particular, in the case of thick film preparation of YBCO using MgO substrate, where the processing temperature required is well above 900° C., the Ba salt formation and cation interdiffusion reduce the superconducting transition $\tau_{c(o)}$ of YBCO thick film very appreciably [Bansal, Mater. Lett., 13, 7 (1992)]. Other commercially available substrates such as Si, $SiO_2$, $Al_2O_3$, $SrTiO_3$, $GaAlO_3$, $LaAlO_3$ etc. either chemically react with YBCO or have a high dielectric constant and loss factor, which makes them unsuitable or less attractive as substrates for YBCO at microwave frequencies. The main object of the present invention is to produce a process for the preparation of ceramic substrates of $REBa_2MO_6$ (where RE=Rare Earth metals—Ce, Pr, Nd, Sm, Eu, Gd, Tb, Dy, Ho, Er, Tm, Yb, Lu and M=Nb, Sb, Sn, Hf, Zr) which are chemically compatible with YBCO and have very low dielectric constant and loss factor making them suitable for microwave applications.

SUMMARY OF THE INVENTION

We have now invented novel ceramic substrates useful for the preparation of superconducting $YBa_2Cu_3O_{7-\delta}$ films. These substrates are having a formula $REBa_2MO_6$ wherein RE represents metals—Ce, Pr, Nd, Sm, Eu, Gd, Tb, Dy, Ho, Er, Tm, Yb, Lu and M represents metals Nb, Sb, Sn, Hf, Zr.

Another aspect of the present invention relates to a process for the preparation of new ceramic substrates of the formula $REBa_2MO_6$ where RE represents (rare-earth metals Ce, Pr, Nd, Sm, Eu, Gd, Tb, Dy, Ho, Er, Tm, Yb, Lu) and M represents metals Nb, Sb, Sn, Hf, Zr, useful for the preparation of superconducting films.

In addition, we have successfully screen-printed a thick film or YBCO with a zero transition temperature $T_{c(o)}=92K$ on these substrates for the first time.

Thus, the present invention provides novel ceramic substrates, a novel process for preparing these substrates and a process for the preparation of superconducting $YBa_2Cu_3O_{7-\delta}$ thick films on these new ceramic substrates.

Accordingly, one embodiment of the present invention relates to a process for the preparation of new ceramic substrates of the formula $REBa_2MO_6$ where RE represents rare earth metals and M represents metals Nb, Sb, Sn, Hf, Zr useful for the preparation of superconducting films which comprises, (i) reacting, salts of the rare earth metals, barium and Nb, Sb, Sn, Hf, Zr in an organic medium, (ii) pressing the resultant mixture in the form of pellets, (iii) calcining the pellets by heating at a temperature in the range of 1000° to 1200° C., (iv) repeating the calcination process for 30 to 45 h, preferably 12 h for each calcination, at temperature in the range of 1000° to 1200° C. till a highly homogeneous mixture is formed, (v) grinding the calcined material and pelletizing at a pressure in the range of 3 to 6 tons/cm², and (vi) sintering the resultant product at a temperature in the range of 1200° to 1600° C. for a period of 10 to 30 h preferably 20 h and then furnace cooled to room temperature.

The salts of the rare earths, barium and other metals used may be selected from oxides, carbonates or nitrates. The purity of the salts may be of 99%. The organic medium used may be selected from organic solvents such as acetone, ethyl alcohol, isopropyl alcohol. Three multiple calcinations of the pellets may be conducted at temperature 1000° to 1200° C. for a period ranging from 10 to 15 h preferably 12 h for each calcination. The sintering of the final product may effected for a period of 10 to 30 h, preferably for 20 h.

In view of the suitability of $REBa_2MO_6$ substrates, we have successfully screen-printed a thick film of YBCO with a zero superconducting transition up to 92K on these substrates.

Thus, yet another aspect of the present invention relates to a process for the preparation of superconducting $YBa_2Cu_3O_7-\delta$ thick films on new ceramic substrates of the formula $REBa_2MO_6$ where RE represents rare earth metals and M represents metals Nb, Sb, Sn, Hf, Zr, useful for the preparation of superconducting films which comprises, (i) mechanically polishing the ceramic substrate of the above said formula to get highly smooth and shining surfaces, (ii) preparing thick film of YBCO by known methods, (iii) screen printing YBCO on said polished $REBa_2MO_6$ substrates using a mesh size in the range of 325, (iv) drying the resulting films at a temperature in the range of 100° to 150° C., (v) heating the dried films at a rate of 150° to 250° C./h up to 960° to 1000° C. and soaking at this temperature for 1 to 5 minutes, (vi) cooling the film at a rate of 400° to 600° C./h to bring down the temperature to 800° C. and keeping the films at this temperature for a period of 20 to 40 minutes, and (vii) cooling the film at a rate of 150° to 250° C./h up to 600° to 400° C. and keeping the film at this temperature for a period of 1 to 2 h. Finally the film is furnace cooled to room temperature.

All the above steps are carried out in the presence of air or flowing oxygen.

DETAILED DESCRIPTION OF THE INVENTION

The details of the invention are described in the Examples given below which are provided by way of illustration only and should not be construed to limit the scope of the invention.

EXAMPLE 1

Preparation of Ceramic Substrate of the Formula $GdBa_2NbO_6$ $GdBa_2NbO_6$ was prepared by solid state reaction method. $Gd_2O_3$, $BaCO_3$ and $Nb_2O_5$ (purity 99%) were taken in stoichiometric ratio, mixed thoroughly in acetone medium and calcined in air at 1150° C. for 12 h with two intermediate grindings. The resultant mixture was powdered and pressed at a pressure of 4 tons/cm² in the form of circular pellets and sintered in air at 1450° C. for 20 h.

EXAMPLE 2

Preparation of Ceramic Substrate of the Formula $NdBa_2SbO_6$ $NdBa_2SbO_6$ was prepared by solid state reaction method. $Nd_2O_3$, $BaCO_3$ and $Sb_2O_3$ (purity 99%) were taken in stoichiometric ratio, mixed thoroughly in acetone medium and calcined in air at 1100° C. for 10 h with two intermediate grindings. The resultant mixture was powdered and pressed at a pressure of 5 tons/cm², in the form of circular pellets and sintered in air at 1400° C. for 16 h.

EXAMPLE 3

Preparation of Ceramic Substrate of the Formula $SmBa_2NbO_6$ $SmBa_2NbO_6$ was prepared by solid state reaction method. $Sm_2O_3$, $BaCO_3$ and $Nb_2O_5$ were taken in stoichiometric ratio, wet mixed in acetone medium and calcined in air at 1200° C. for 15 h with two intermediate grindings. Calcined powder was finally, ground and pelletized at a pressure of 5 tons/cm² in the form of circular pellets and sintered at 1350° C. for 15 h in air.

Structure Determination

Figure 1:
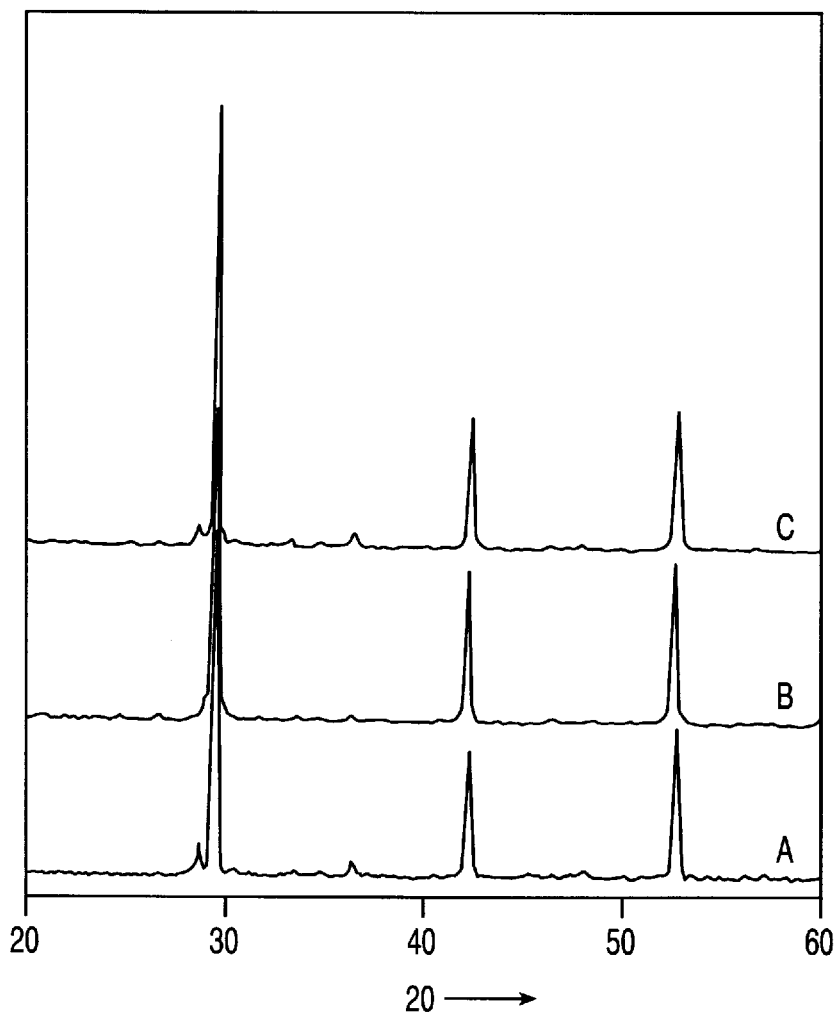
FIG. 1 is a graph showing X-ray diffraction patterns of sintered (A) $GdBa_2NbO_6$, (B) $NdBa_2SbO_6$ and (C) $SmBa_2NbO_6$.

The structure of the sintered materials was examined by X-ray diffraction (XRD) method and it is found that all these materials are isostructural having a cubic perovskite structure as shown in the XRD patterns in FIG. 1 (Sheet No. 1) of the drawings accompanying this specification for three typical samples $GdBa_2NbO_6$ (Example 1), $NdBa_2SbO_6$ (Example 2) and $SmBa_2NbO_6$ (Example 3). In tables 1a to c we have given the computerized XRD data for these materials.

TABLE 1(a)

Computerized XRD data $GdBa_2NbO_6$

| No. | 2 | Intensity | Width | d | I/Io |
|---|---|---|---|---|---|
| 1 | 29.780 | 7988 | 0.459 | 2.998 | 100 |
| 2 | 36.730 | 594 | 0.480 | 2.445 | 7 |
| 3 | 42.660 | 2358 | 0.525 | 2.118 | 30 |
| 4 | 52.890 | 2882 | 0.555 | 1.730 | 36 |

TABLE 1(b)

Computerized XRD data $NdBa_2SbO_6$

| No. | 2 | Intensity | Width | d | I/Io |
|---|---|---|---|---|---|
| 1 | 29.740 | 9506 | 0.375 | 3.002 | 100 |
| 2 | 36.690 | 250 | 0.210 | 2.447 | 3 |
| 3 | 42.510 | 2776 | 0.420 | 2.125 | 29 |
| 4 | 52.680 | 3004 | 0.555 | 1.736 | 32 |

TABLE 1(c)

Computerized XRD data $SmBa_2NbO_6$

| No. | 2 | Intensity | Width | d | I/Io |
|---|---|---|---|---|---|
| 1 | 29.730 | 7988 | 0.420 | 3.003 | 100 |
| 2 | 36.630 | 476 | 0.270 | 2.451 | 6 |
| 3 | 42.570 | 2569 | 0.435 | 2.122 | 32 |
| 4 | 52.780 | 2750 | 0.495 | 1.733 | 34 |

Dielectric Properties

The dielectric properties of the substrate materials were measured at 30 Hz to 13 MHz frequencies and values of the dielectric constant ($\epsilon'$) and loss factor (tan δ) at 13 MHz frequency are 24 and $10^{-4}$ respectively at room temperature. At GHz frequencies the values of $\epsilon'$ and tan δ are found to be −6 and $10^{-5}$ respectively, which are ideally suitable for microwave applications.

Chemical Compatibility with YBCO

Figure 2:
FIG. 2 is a graph showing X-ray diffraction patterns of (A) $YBa_2Cu_3O_7$, (B) $YBa_2Cu_3O_{7-\delta}$ - $GdBa_2NbO_6$, (C) $YBa_2Cu_3O_{7-\delta}$-$NdBa_2SbO_6$ and (D) $YBa_2Cu_3O_{7-\delta}$-$SmBa_2NbO_6$.

The most important characteristics of $REBa_2MO_6$, which makes these materials ideal as substrates for YBCO, is their chemical non-reactivity with YBCO even at extreme processing conditions. The chemical reactivity between YBCO and $REBa_2MO_6$ was studied by mixing 1:1 molar mixture of YBCO and $REBa_2MO_6$ and heating the pressed samples at 950° C. for 15 h. In FIG. 2 (sheet No. 2), the XRD pattern of a pure $YBa_2Cu_3O_{7-\delta}$ superconductor (FIG. 2a) and three representative XRD patterns of annealed $YBa_2Cu_3O_{7-\delta}$ - $GdBa_2NbO_6$ (FIG. 2b). $YBa_2Cu_3O_7$ - $NdBa_2SbO_6$ (FIG. 2c) and $YBa_2Cu_3O_{7-\delta}$ - $SmBa_2NbO_6$ (FIG. 2d) samples mixed in 1:1 molar ratio and heated at 950° C. for 15 h have been given. The XRD patterns clearly show that there is no additional phase formed besides YBCO and $REBa_2MO_6$ in the composite. This indicates that there is no reaction taking place between YBCO and $REBa_2MO_6$ even under severe heat treatment. $REBa_2MO_6$ are insulating oxides with room temperature resistivities of the order of $10^{10}$ $\Omega$cm. Detailed percolation studies carried out on YBCO-$REBa_2MO_6$ composites also showed that the presence of $REBa_2MO_6$ up to 60 vol % in the composite did not show any detrimental effect on the super-conducting transition temperature of YBCO.

Because of the excellent dielectric properties and chemical compatibility of the novel substrates with YBCO as described above, we also invented a process for the preparation of superconducting $YBa_2Cu_3O_{7-\delta}$ thick films on the newly developed ceramic substrates of $REBa_2MO_6$ as described above. In other words, in view of the suitability of $REBa_2MO_6$ substrates, we have successfully screen printed a thick film of YBCO with a zero superconducting transition up to 92K on these substrates.

We quote a few prior art references regarding the formation of superconducting films here below:

Superconducting thick films have wide applications in microwave integrated circuits transmission lines and other microelectronic devices [Alford et al., Supercond. Sci. Technol., 4, 433 (1991), Khare et al., Supercond. Sci. Technol, 4, 107 (1991) and Alford et al., Nature, 349, 680 (1991)]. Screen printing is a straight forward and highly economical process for the deposition of thick films of $YBa_2Cu_3O_{7-\delta}$ (YBCO) superconductors [Budhani et al., Appl. Phys. Lett., 51, 1277 (1987), Shih and Riu, Appl. Phys. Lett., 52, 748 (1988), Koinuma et al., Jpn. J. Appl. Phys., 26, L399 (1987), Bansal and Simon, Appl. Phys. Lett., 53, 603 (1988) and Bansal, Mater. Lett., 13, 7 (1992)]. In the preparation of superconducting thick films, the choice of substrate is a key factor. Chemical non-reactivity between the substrates and YBCO is most crucial for obtaining superconducting films with high transition temperature (≈90K).

Figure 3:
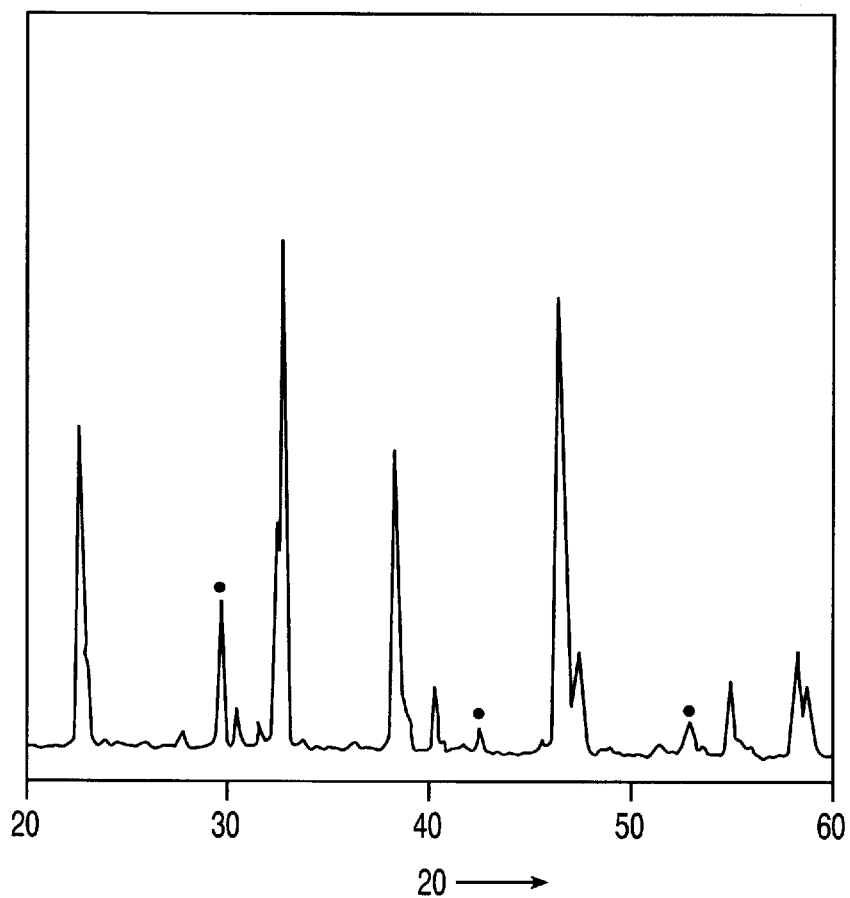
FIG. 3 is a graph showing X-ray diffraction patterns of screen-printed $YBa_2Cu_3O_{7-\delta}$ thick film on $NdBa_2SbO_6$ (substrate peaks are marked by "●")
Figure 4:
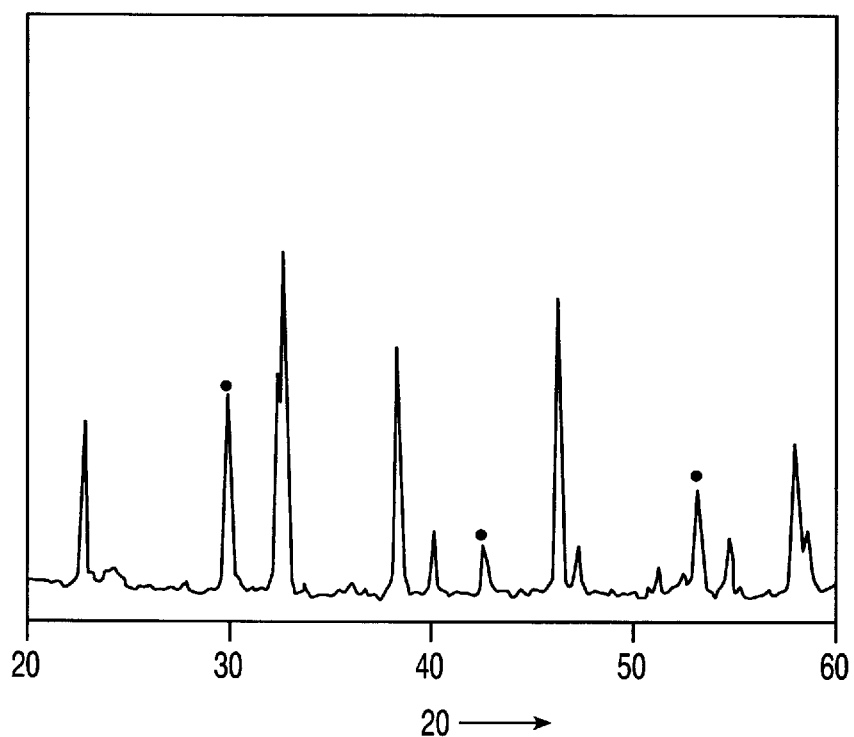
FIG. 4 is a graph showing X-ray diffraction patterns of screen-printed $YBa_2Cu_3O_{7-\delta}$ thick film on $SmBa_2NbO_6$ (substrate peaks are marked by "●")

Our process for fabrication of YBCO screen-printed thick film on $REBa_2MO_6$ substrates is given below:

Before screen-printing YBCO, $REBa_2MO_6$ substrates were polished mechanically to get highly smooth and shining surfaces. Thick film paste of YBCO, which we used for screen printing was made by mixing YBCO powder with an organic vehicle and well mixed paste was achieved by hand milling. Film thickness was controlled via viscosity control of YBCO paste. Thick film of this YBCO paste was then screen-printing on $REBa_2MO_6$ substrate using a mesh size of 325. Printed films were dried at 100°0 to 150° C. for 2 to 3 h. Dried films were heated in a programmable furnace at a rate of 150° to 250° C./h up to 950°–1000° C. and soaked at this temperature for 1–5 min. The films were cooled down at a rate of 400°–600° C./h and brought down to 800°–900° C. and kept at this temperature for 20–40 min and films were then cooled down at a rate of 150° C. to 250° C./h up to 600°–400° C. and kept at this temperature for 1 to 2 h and after that cooled down to room temperature. All the above processing were done either in air or in flowing oxygen. The structure of the film was examined by X-ray diffraction method and XRD patterns of two typical screen-printed YBCO films on $NdBa_2SbO_6$ and $SmBa_2NbO_6$ substrates are shown in FIGS. 3 and 4 (given in sheet Nos. 3 and 4) respectively. The XRD patterns of these YBCO thick films showed that except for the characteristic peaks of $NdBa_2SbO_6$ and $SmBa_2NbO_6$ substrates, all other peaks could be assigned to a phase pure orthorhombic superconducting YBCO structure.

In the following examples illustrate the preparation of superconducting films employing the novel substrates:

EXAMPLE 4

Preparation of Superconducting Film Using Ceramic Substrate of the Formula $NdBa_2SbO_6$ A $YBa_2Cu_3O_{7-\delta}$ paste was made by mixing fine $YBa_2Cu_3O_{7-\delta}$ powder with organic vehicle and its viscosity was controlled by adding fish oil. This paste was screen-printed on a highly polished $NdBa_2SbO_6$ substrate using a screen of 325 mesh size. The film, after drying at 100° C. for 90 minutes was heated in a programmable furnace at a rate of 3° C./minute up to 980° C. and soaked at this temperature for 5 minutes. It was then cooled at a rate of 10° C./minute to bring down the temperature to 900° C. and kept at 900° C. for 30 minutes. It was then cooled to 600° C. at a rate of 4° C./minute and again kept at this temperature for 60 minutes. The film was finally furnace cooled to room temperature. Entire processing was carried out in air.

EXAMPLE 5

Preparation of Superconducting Film Using Ceramic Substrate of the Formula $SmBa_2NbO_6$ A $YBa_2Cu_3O_{7-\delta}$ paste was made by mixing fine $YBa_2Cu_3O_{7-\delta}$ powder with organic vehicle and its viscosity was controlled by adding fish oil. The paste was screen-printed on highly polished $SmBa_2NbO_6$ substrate using a screen of 325 mesh size. The film, after drying at 120° C. for 60 minutes was heated in a programmable furnace at a rate of 3° C./minute up to 980° C., soaked at this temperature for 5 minutes. It was then cooled at a rate of 8° C./minute to bring down the temperature to 900° C. for 30 minutes. It was then cooled to 550° C. at a rate of 3° C./minute and again kept at this temperature for 60 minutes. The film was finally furnace cooled to room temperature. The entire processing was done in air.

The structure of the film was examined by X-ray diffraction method. The XRD patterns of two typical screen-printed YBCO films on $NdBa_2SbO_6$ (Example 4) and $SmBa_2NbO_6$ (Example 5) substrates are shown in FIGS. 3 and 4 of the drawings (Sheet Nos. 3 and 4) accompanying this specification. The XRD pattern of these YBCO thick films showed that except for the characteristic peaks of $NdBa_2SbO_6$ and $SmBa_2NbO_6$ substrates, all other peaks could be assigned to a phase pure orthorhombic superconducting YBCO structure.

Figure 5:
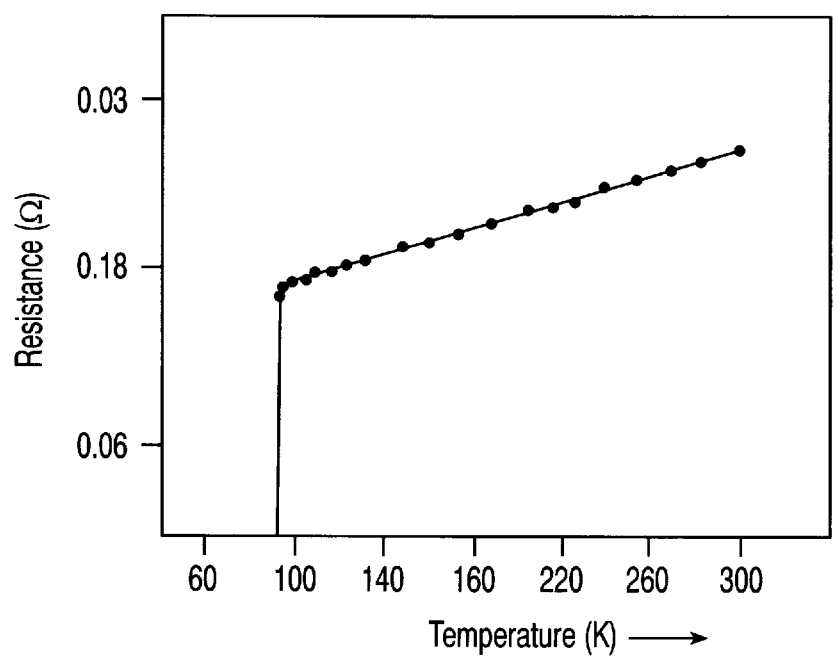
FIG. 5 is a graph showing the temperature-resistance curve of screen-printed $YBa_2Cu_3O_{7-\delta}$ thick film on $NdBa_2SbO_6$ substrate.
Figure 6:
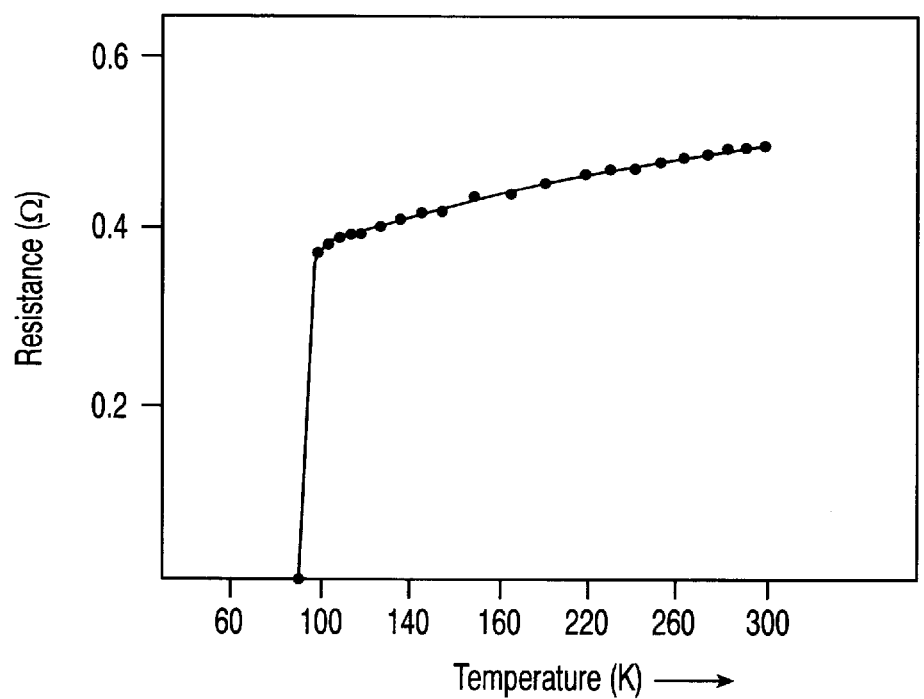
FIG. 6 is a graph showing the temperature-resistance curve of screen-printed $YBa_2Cu_3O_{7-\delta}$ thick film on $SmBa_2NbO_6$ substrate.

Superconductivity in these YBCO screen-printed thick films on $REBa_2MO_6$ substrates were studied by temperature-resistance measurements. The films show a metallic behavior in the normal state and give superconducting transition temperature of 88–94K ($T_c$ onset) and 85–92K ($T_{c(o)}$ as shown in the two representative examples given in FIGS. 5 and 6 (sheet Nos. 5 and 6). These films give a current density of the order of $10^5$ $A/cm^2$.

We claim:

1. A composite comprising a superconducting film and a substrate, wherein said superconducting film comprises $$YBa_2Cu_3O_{7-\delta}$$

and said substrate is a ceramic compound having the formula $$REBa_2MO_6$$

wherein RE is a member of the group consisting of Ce, Pr, Nd, Sm, Eu, Gd, Tb, Dy, Ho, Er, Tm, Yb and Lu and M is a member of the group consisting of Nb, Sb, Sn, Hf, and Zr.

2. The composite of claim 1 wherein the substrate is a ceramic compound having the formula $GdBa_2NbO_6$.

3. The composite of claim 1 wherein the substrate is a ceramic compound having the formula $NdBa_2SbO_6$.

4. The composite of claim 1 wherein the substrate is a ceramic compound having the formula $SmBa_2NbO_6$.

* * * * *